(12) United States Patent
Nadakumar et al.

(10) Patent No.: US 6,452,236 B1
(45) Date of Patent: Sep. 17, 2002

(54) CHANNEL IMPLANT FOR IMPROVING NMOS ESD ROBUSTNESS

(75) Inventors: Mahalingam Nadakumar, Richardson; Song Zhao, Dallas, both of TX (US)

(73) Assignee: Texas Instruments, Incorporated, Dallas, TX (US)

( * ) Notice: Subject to any disclaimer, the term of this patent is extended or adjusted under 35 U.S.C. 154(b) by 0 days.

(21) Appl. No.: 09/870,901

(22) Filed: May 31, 2001

(51) Int. Cl.$^7$ ................................. A01L 23/62

(52) U.S. Cl. ................. 257/356; 257/355; 257/357; 257/358; 257/361; 257/362

(58) Field of Search ................. 257/361, 362, 257/356–360, 355, 265

(56) References Cited

U.S. PATENT DOCUMENTS

| | | | | |
|---|---|---|---|---|
| 5,472,897 A | * | 12/1995 | Hsu et al. | 437/44 |
| RE35,642 E | * | 10/1997 | Frisina et al. | 257/327 |
| 5,712,501 A | * | 1/1998 | Davies et al. | 257/335 |
| 5,773,863 A | * | 6/1998 | Burr et al. | 257/344 |
| 5,818,098 A | * | 10/1998 | Davies et al. | 257/506 |
| 5,891,792 A | * | 4/1999 | Shih et al. | 138/525 |
| 5,923,070 A | * | 7/1999 | Yamada | 7/99 |
| 5,985,705 A | * | 11/1999 | Seliskar | 438/197 |
| 6,005,285 A | * | 12/1999 | Gardner et al. | 257/607 |
| 6,163,053 A | * | 12/2000 | Kawashima | 257/535 |

* cited by examiner

*Primary Examiner*—Eddie Lee
*Assistant Examiner*—Jesse A. Fenty
(74) *Attorney, Agent, or Firm*—Godwin Gruber, P.C.; Gary C. Honeycutt

(57) ABSTRACT

A lateral NMOS transistor in a p-well, bordered laterally on each side by an isolation region and vertically by a stopping region, has a n-source and a n-drain, each comprising a shallow region extending to the transistor gate and a deeper region recessed from the gate. The transistor further has in its p-well a region of higher resistivity than the remainder of the well. This region extends laterally from the vicinity of one of the recessed region to the vicinity of the other, and vertically from a depth just below the depletion regions of source and drain to the top of the channel stop region.

According to the invention, this region of higher p-type resistivity is created by an ion implant of compensating n-doping, such as arsenic or phosphorus, using the same photomask already used for implants adjusting the threshold voltage and creating the p-well and channel stop.

In an ESD event, this region of higher resistivity increases the current gain of the parasitic lateral npn bipolar transistor and thus raises the current It2, which initiates the thermal breakdown with its destructive localized heating.

13 Claims, 3 Drawing Sheets

CHANNEL IMPLANT FOR IMPROVING NMOS ESD ROBUSTNESS

FIELD OF THE INVENTION

The present invention is related in general to the field of electronic systems and semiconductor devices, and more specifically to structure and fabrication methods of MOS transistors, which have an additional implant under the channel compared to standard technology.

DESCRIPTION OF THE RELATED ART

Integrated circuits (ICs) may be severely damaged by electrostatic discharge (ESD) events. A major source of ESD exposure to ICs is from the charged human body ("Human Body Model", HBM); the discharge of the human body generates peak currents of several amperes to the IC for about 100 ns. A second source of ESD is from metallic objects ("machine model", MM); it can generate transients with significantly higher rise times than the HBM ESD source. A third source is described by the "charged device model" (CDM), in which the IC itself becomes charged and discharges to ground in the opposite direction than the HBM and MM ESD sources. More detail on ESD phenomena and approaches for protection in ICs can be found in A. Amerasekera and C. Duvvury, "ESD in Silicon Integrated Circuits" (John Wiley & Sons LTD. London 1995), and C. Duvvury, "ESD: Design for IC Chip Quality and Reliability" (Int. Symp. Quality in El. Designs, 2000, pp. 251–259; references of recent literature).

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an NMOS device whose drain is connected to the pin to be protected and whose source is tied to ground. The protection level or failure threshold can be set by varying the NMOS device width from the drain to the source under the gate oxide of the NMOS device. Under stress conditions, the dominant current conduction path between the protected pin and ground involves the parasitic bipolar transistor of that NMOS device. This parasitic bipolar transistor operates in the snapback region under pin positive with respect to ground stress events.

The dominant failure mechanism, found in the NMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak NMOS device temperature, at which second breakdown is initiated, is known to increase with the stress current level.

Many circuits have been proposed and implemented for protecting ICs from ESD. One method that is used to improve ESD protection for ICs is biasing the substrate of ESD protection circuits on an IC. Such substrate biasing can be effective at improving the response of a multi-finger MOS transistor that is used to conduct an ESD discharge to ground. However, substrate biasing can cause the threshold voltages for devices to change from their nominal values, which may affect device operation. In addition, substrate biasing under steady-state conditions causes heat generation and increases power losses.

Solutions offered in known technology require additional IC elements, silicon real estate, and/or process steps (especially photomask alignment steps). Their fabrication is, therefore, expensive. Examples of device structures and methods are described in U.S. Pat. No. 5,539,233, issued Jul. 23, 1996 (Amerasekera et al., "Controlled Low Collector Breakdown Voltage Vertical Transistor for ESD Protection Circuits"); U.S. Pat. No. 5,793,083, issued Aug. 11, 1998 (Amerasekera et al., "Method for Designing Shallow Junction, Salicided NMOS Transistors with Decreased Electrostatic Discharge Sensitivity"); U.S. Pat. No. 5,940,258, issued Aug. 17, 1999 (Duvvury, "Semiconductor ESD Protection Circuit"); U.S. Pat. No. 6,137,144, issued Oct. 24, 2000, and U.S. Pat. No. 6,143,594, issued Nov. 7, 2000 (Tsao et al, "On-Chip ESD Protection in Dual Voltage CMOS); and U.S. patent application Ser. No. 09/456,036, filed Dec. 3, 1999 (Amerasekera et al., "Electrostatic Discharge Device and Method").

The influence of substrate well profiles on the device ESD performance is investigated, for instance, in "Influence of Well Profile and Gate Length on the ESD Performance of a Fully Silicided 0.25 µm CMOS Technology" (K. Bock, C. Russ, G. Badenes, G. Groeseneken and L. Deferm, Proc. EOS/ESD Symp., 1997, pp. 308–315). However, known technology recommends only a lower epitaxial doping or a lower implant dose as methods to increase the p-well resistance.

The challenge of cost reduction implies a drive for minimizing the number of process steps, especially a minimum number of photomask steps, and the application of standardized process conditions wherever possible. These constraints should be kept in mind when additional process steps or new process conditions are proposed to improve ESD insensitivity without sacrificing any desirable device characteristics. An urgent need has, therefore, arisen for a coherent, low-cost method of enhancing ESD insensitivity without the need for additional, real-estate consuming protection devices. The device structure should further provide excellent electrical performance, mechanical stability and high reliability. The fabrication method should be simple, yet flexible enough for different semiconductor product families and a wide spectrum of design and process variations. Preferably, these innovations should be accomplished without extending production cycle time, and using the installed equipment, so that no investment in new manufacturing machines is needed.

SUMMARY OF THE INVENTION

A lateral NMOS transistor in a p-well, bordered laterally on each side by an isolation region and vertically by a stopping region, has a n-source and a n-drain, each comprising a shallow region extending to the transistor gate and a deeper region recessed from the gate. The transistor further has in its p-well a region of higher resistivity than the remainder of the well; this region extends laterally from one recessed region to the other, and vertically from a depth just below the depletion regions to the depth of the stopping region.

According to the invention, this region of higher p-type resistivity is created by an ion implant of compensating n-doping, such as arsenic or phosphorus, using the same photomask already used for implants adjusting the threshold voltage and creating the p-well and channel stop.

In an ESD event, this region of higher resistivity increases the current gain of the parasitic lateral npn bipolar transistor and thus raises the current It2, which initiates the thermal breakdown with its destructive localized heating.

When the gate, source and substrate terminals are at 0 V and the drain at positive potential, the current gain β of the lateral bipolar npn transistor in the ESD event is defined as $$\beta = (Id - Igen)/(Igen - Isub),$$

where

Id = drain current,
Igen = Ib + Isub,
Ib = base current,
Isub = hole current from the collector junction through the substrate to the backside contact.

It is an aspect of the invention that the region of higher resistivity is the substrate of the transistor, enabling full functioning. of the transistor while not affecting operation of neighboring active devices.

Another aspect of the invention is that the region of higher resistivity improves the ESD protection of the transistor without decreasing latch-up robustness or increasing inadvertent substrate current-induced body biasing of neighboring transistors.

Another aspect of the invention is that it is equally applicable to PMOS transistors; the conductivity types of the semiconductor and the ion implant types are simply reversed.

The method of fabricating the region of higher resistivity under the active area of a high-voltage NMOS transistor having a gate comprises the steps of depositing a photoresist layer over the transistor and opening a window in this layer over the active area of the transistor; then implanting, at high energy, n-doping ions into the p-type semiconductor substrate through the window, creating a deep region having a net p-type doping lower than that of the p-type semiconductor remote from the transistor active area. A preferred depth of the region is between 50 and 150 nm. A region too deep would require higher implant energy with possibly more damage and thus higher junction leakage current or junction isolation failure.

It is an essential aspect of the present invention that this high-energy ion implant is performed without the need for a new photomask step. This economical feature renders the additional high-energy ion implant step of the present invention exceedingly inexpensive.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application No. 60/263,619, filed on Jan. 23, 2001 (Salling, "Structure and Method of MOS Transistor having Increased Substrate Resistance").

Figure 1:
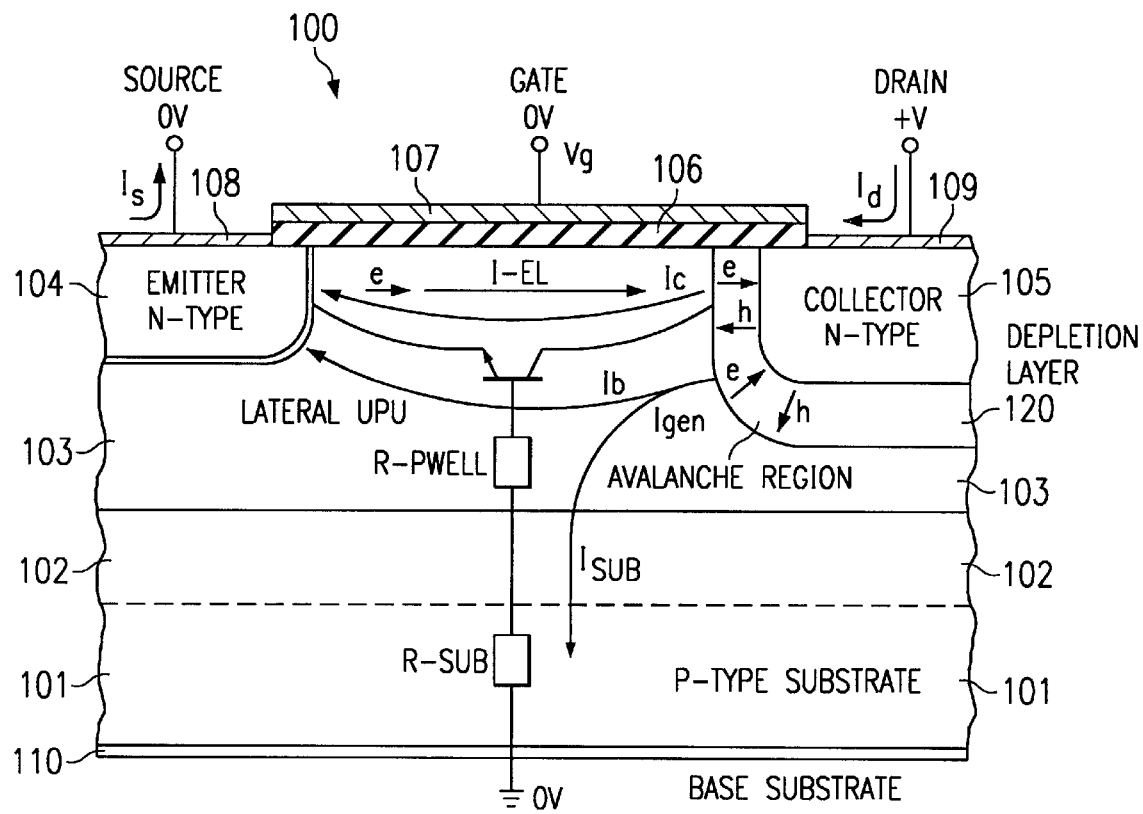
FIG. 1 is a simplified and schematic cross section through a lateral MOS transistor, illustrating the current flow at an electrostatic discharge event.

The impact of the present invention can be most easily appreciated by highlighting the shortcomings of the known technology. The schematic cross section of FIG. 1 illustrates a commonly used integrated circuit (IC) component 100 in an ESD protection circuit, namely an NMOS transistor which operates in the mode of a lateral bipolar npn transistor during an ESD event and provides a low impedance current path to ground. The IC is formed in a semiconductor of a "first conductivity" type; in the example of FIG. 1, this "first conductivity" is p-type, the MOS transistor is an NMOS transistor, and the lateral bipolar transistor is a npn transistor. In present manufacturing, the first conductivity type semiconductor is created by the net doping due to a "substrate" and a "well".

As defined herein, the term "substrate" refers to the starting semiconductor wafer. In present manufacturing, the substrate typically has p-type doping. For clarity, this case is also selected as the basis for the following discussions. It should be stressed, however, that the invention and all description also cover the case where the substrate has n-type doping. In FIG. 1, the substrate is designated 101. Frequently, but not necessarily, an epitaxial layer 102 of the same conductivity type as the substrate has been deposited over the substrate 101; in this case the term "substrate" refers to epitaxial layer 102 plus starting semiconductor 101. For the conductivity example selected for FIG. 1, a p-well 103 has been formed by localized acceptor ion implantation and annealing. An n-plus source region 104 (the emitter of the bipolar transistor) and drain region 105 (the collector of the bipolar transistor) were formed by shallow ion implants of donors. The surface between the emitter 104 and the collector 105 is covered by gate oxide layer 106. Layers 107, 108, 109, and 110 provide metallic contacts to the gate, emitter, collector and the wafer backside, respectively.

FIG. 1 further shows that emitter 108, gate 107 and wafer backside 110 are electrically connected to ground potential (0 V). A positive voltage spike at the collector, as caused by an ESD event, applies a reverse bias to the collector/base junction; the base is the substrate 101 (in some devices, epitaxial layer 102 plus the substrate 101); the depletion layer of the space charge region is designated 120. When the electric field in the depletion region 120 exceeds the breakdown field, avalanching occurs and forms electron/hole pairs. Electrons flow into the collector, and holes flow into the p-type base.

This hole current Isub flows from the collector junction through the substrate to the backside contact 110, causing a voltage drop across the resistors R-pwell and R-sub, which positive (forward) biases the emitter/base junction. This emitter forward bias is proportional to the effective "substrate resistance" equal to the sum of the resistance components in the current path, which are schematically shown as R-pwell and R-sub in FIG. 1. Those of the electrons injected from the emitter into the base which reach the collector depletion layer will participate in the avalanche mechanism.

Figure 2:
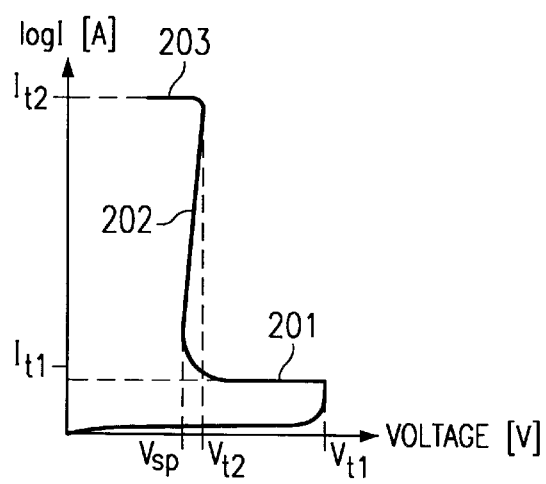
FIG. 2 is a schematic plot of drain (collector) current, on a logarithmic scale, as a function of drain voltage, on a linear scale, illustrating the onset of the second breakdown phenomenon.

The electron concentration will be multiplied in accordance with the electric field dependent avalanche multiplication factor. The resulting reduction of the device impedance is reflected in a "snap back" 201 in the current-voltage characteristic, which corresponds to a "turn on" of the bipolar transistor. FIG. 2 plots the collector (or drain) current I (on a logarithmic scale) as a function of drain voltage V (on a linear scale). As illustrated in FIG. 2, this snap-back 201 occurs at the collector/drain voltage Vtl with an associated collector/drain current It1. The field dependence of the avalanche multiplication factor is responsible for establishing a new stable current/voltage equilibrium 202. At high electron injection levels, base conductivity modulation also contributes towards making the device impedance positive again. It should be mentioned that the lateral npn transistor also protects against negative ESD pulses. The collector 105 (in FIG. 1) now acts as emitter and diverts the ESD current to the backside substrate contact 110 and to the now reverse biased emitter 104, which now acts as collector.

The current carrying capability of the device is limited by thermal effects in the avalanching collector depletion layer. A number of effects (such as the increase of intrinsic carrier concentration, a reduced carrier mobility, a decrease in thermal conductivity, and a lowering of the potential barrier for tunnel currents) contribute to the onset of the second (thermal) breakdown (203 in FIG. 2). The second breakdown trigger current It2 is very sensitive to the device design, especially the doping profiles. Second breakdown results in junction melting and in an irreversible increase in leakage currents. It must, therefore, be avoided for normal device operation.

It is important for the present invention to conclude from FIG. 1 and the above discussion of FIG. 2 that increasing the resistors R-pwell and/or R-sub will lead to an earlier turn-on of the emitter and to a reduction of the current contribution of the avalanche mechanism. This is reflected in an increase of the second breakdown threshold current It2. As was pointed out in the above-referenced publication by K. Bock et al., the p-well resistance R-pwell, and thus It2, can be modified by the p-well doping. However, known technology recommended only a lower substrate (or epitaxial) doping or a lower implant dose as methods to increase the p-well resistance.

The present invention discloses an additional, compensating n-type implant into the p-well to produce a lowly doped p$^-$-region below the MOS transistor depletion region and above the channel stop to improve the bipolar current gain $\beta$.

As defined herein, geometrical and positional terms such as "vertical", "below", "above", "shallow", and "deep" are used with the active surface of the semiconductor as reference line. According to this definition, the surface has "horizontal" orientation. The integrated circuit is built into this active semiconductor surface. The schematic cross sections of FIGS. 1 and 3 illustrate these positional interrelations.

The structure of the modified p-well doping and p-well resistance R-pwell according to the present invention are described in FIGS. 3 to 6, and the flexible and economical method for tailoring R-pwell according to the invention is described in FIGS. 7 to 12. While the examples depicted embody the experimental conditions for an NMOS transistor, analogous considerations hold for the conditions of a PMOS transistor.

Figure 3:
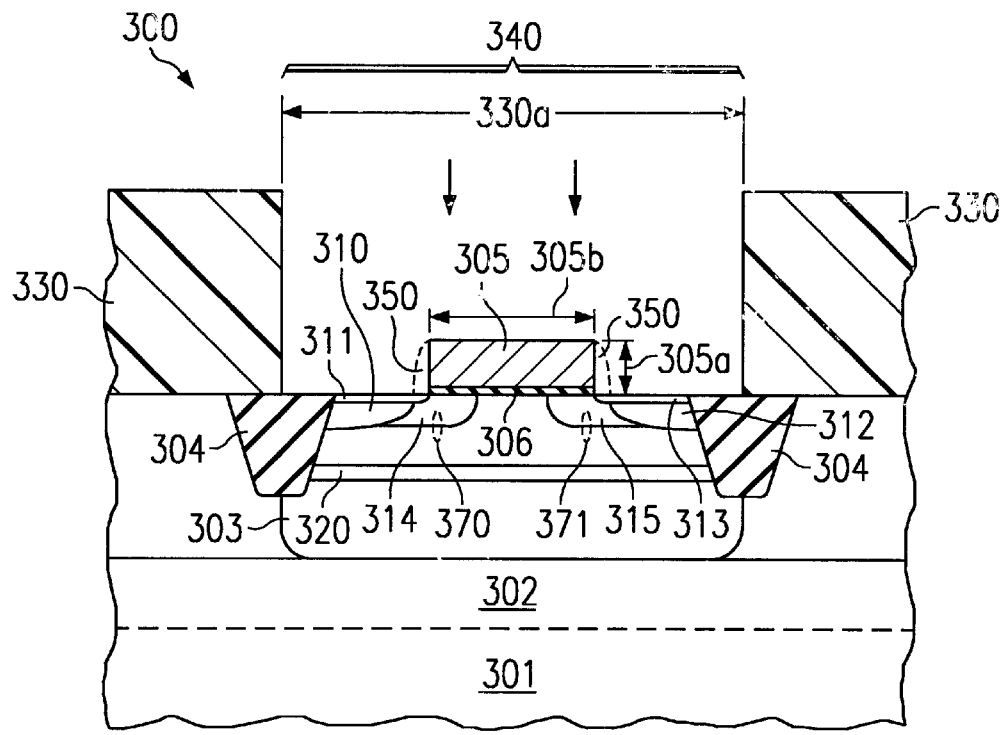
FIG. 3 schematically presents a cross section of a lateral MOS transistor with a photoresist window opened for the high energy ion implant according to the invention.

FIG. 3 shows in simplified and schematic (not to scale) manner a small portion of an IC having on its surface an MOS transistor, generally designated 300, at a certain stage of its fabrication process according to the invention. The invention applies to NMOS as well as PMOS transistors fabricated into semiconductor substrate material. Here, the substrate comprises a semiconductor wafer 301 of p-type doping (onto which, for some devices, an epitaxial layer 302, also of p-type doping, has been deposited). For clarity, the description and discussion of the invention will be for a p-type semiconductor. However, the invention is also applicable if an n-type substrate is used. The semiconductor material may be silicon, silicon germanium, gallium arsenide or any other semiconductor material used in IC fabrication.

The resistivity of the semiconductor substrate, into which the MOS transistor is fabricated, ranges from about 1 to 50 $\Omega$cm (this is also the resistivity of the epitaxial layer). A well 303 of a "first" conductivity type has been fabricated into the substrate. In FIG. 3, window 330a in photoresist 330 is used to create the p-well shown; in other circuit designs, the p-well may extend further. For an NMOS transistor, this "first" conductivity refers to p-type, for a PMOS transistor, to n-type. Silicon dioxide isolation trenches 304 define the active area of the lateral transistor within the p-well. For the gate 305 of the MOS transistor, poly-silicon or another conductive material is usually chosen; its thickness 305a is commonly between 140 and 180 nm, and the width 305b between 0.2 and 1.0 $\mu$m. The gate insulator 306 (silicon dioxide, nitrided SiO2, or others) has a physical thickness between 1 and 10 nm.

FIG. 3 shows a deep source 310 and an extended source 311, further a deep drain 312 and an extended drain 313. The extended source and drain are prepared by low-energy, shallow implants (depth typically between 25 and 40 nm), the deep source and drain by medium-energy implants (depth typically between 100 and 140 nm) as part of the process flow shown in FIGS. 7 to 11. For the fabrication by ion implantation, a window 330a in a photoresist layer 330 is used; window 330a determines the lateral extent and active area of the MOS transistor. The same photoresist and window are used for the additional p-type implant creating the medium-conductivity channel stop layer 320 and the threshold adjust implant directly under the gate (not shown in FIG. 3).

The window 330a is further used for the high-energy, compensating n-type implant of the present invention. This implant is performed for modifying the well resistivity within the opening of window 330a to an average value at least an order of magnitude higher than the resistivity value of the semiconductor of the first conductivity type. In FIG. 3, a dashed line indicates the approximate extent of the region 360 of high resistivity. It should be noted in passing that the thickness of the photoresist layer 330 is larger than the thickness solely required to block the lower energy implants. Preferably, the photoresist layer thickness is between 1.5 and 2.0 $\mu$m. If the high-energy implant accompanies the medium-energy implant, non-conductive sidewalls 350 are typically present as part of the gate structure.

Figure 4:
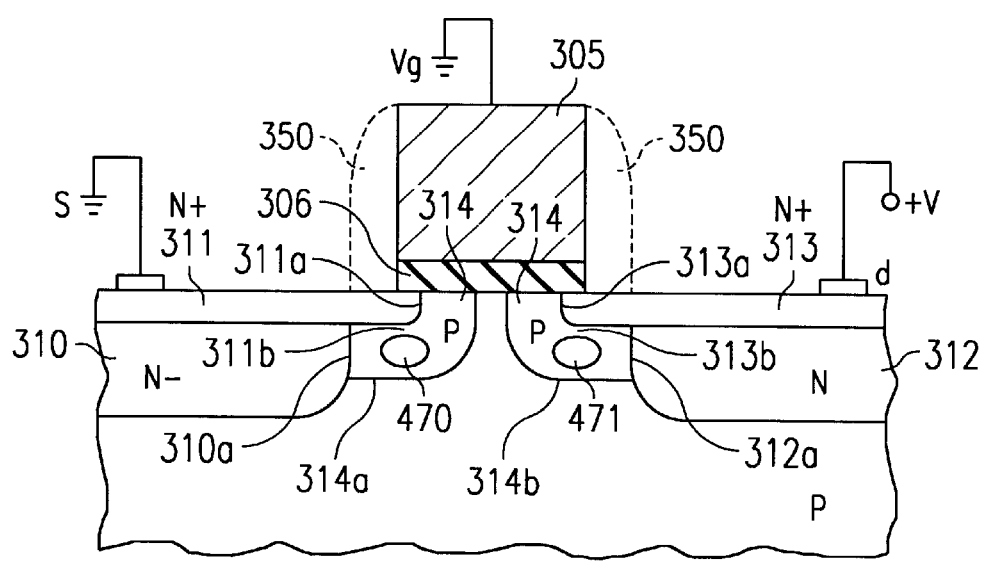
FIG. 4 illustrates schematically, yet in more detail, the cross section of the region of the compensating ion implant of the invention.

The location of the compensating implant region is shown in more detail in FIG. 4. Here, the region of the compensating implant is designated 401. Also shown are the deep source 310 and the extended source 311, as well as the deep drain 312 and the extended drain 313. As can be seen, both deep source 310 and deep drain 312 are recessed relative to their respective extended parts 311 and 313. The region 401 of the compensating n-type implant (and thus of higher p-resistivity) extends laterally from the vicinity of one of the recessed regions, designated 402, to the vicinity of the other, designated 403. It further can be seen that the high resistivity region 401 extends vertically from a depth just below the depletion regions 410 and 411a/411b of the source and drain, respectively, to approximately the "top" of the channel stop region 320 (depth about 300 nm from the surface).

(The shallow trench isolation (STI) 304 is shown in FIG. 4 only to illustrate the relative depths of the regions from the surface; it is laterally not to scale with the rest of the figure.).

For NMOS transistors, the semiconductor well and substrate of the first conductivity type (p-type) (including any epitaxial layer) has dopant species selected from a group consisting of boron, aluminum, gallium, and indium. Source, drain, their extensions, and the region of higher resistivity within the semiconductor of the first conductivity type have a dopant species selected from a group consisting of arsenic, phosphorus, antimony, and bismuth.

For PMOS transistors, the semiconductor well of the first conductivity type (n-type) has dopant species selected from a group consisting of arsenic, phosphorus, antimony, and bismuth. Source, drain, their extensions, and the region of higher resistivity within the semiconductor of the first conductivity type have a dopant species selected from a group consisting of boron, aluminum, gallium, indium, and lithium.

Figure 5:
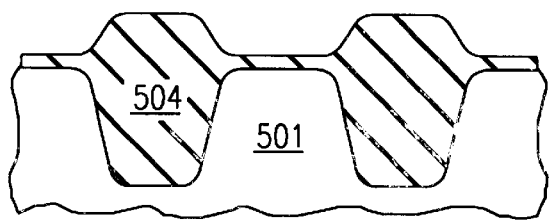
FIG. 5 illustrates an example of the doping profiles employed by the invention.

By way of example for an NMOS transistor, FIG. 5 depicts the doping profiles resulting from the high-energy n-doping implant of the present invention, as simulated by computer programs. The figure shows the profiles of an arsenic implant into boron-doped silicon substrate (p-well) material. The ordinate plots the doping concentrations in logarithmic units, and the abscissa show the penetration depths into the semiconductor surface, expressed in $\mu$m. In addition to the starting boron and the implanted arsenic concentrations, the resulting net doping profile is illustrated. Preferred arsenic implant conditions are: Dose 2 to 4 E+12 cm-2, energy 125 to 150 keV. Other successful examples for the counterdoping of this invention employ phosphorus or antimony.

As can be seen in FIG. 5, the counterdoping of the high-energy arsenic (curve 501) into the original boron doping (curve 502) of the p-type substrate material results in a substantially lowered net doping (curve 503). Consequently, the resulting resistivity is increased. In this example, the resulting resistivity is in first order uniform between a depth of 0.1 to 0.5 $\mu$m.

The precise selection of a successful dose and energy for the compensating implant depends on the p-well background and device operating conditions. For typical conditions, preferred doses are in the 2.0 to 5.0 E+12 cm-2 range, and preferred energies in the 120 to 160 keV range. The maximum $\beta$ achieved is between 60 and 100.

Figure 6:
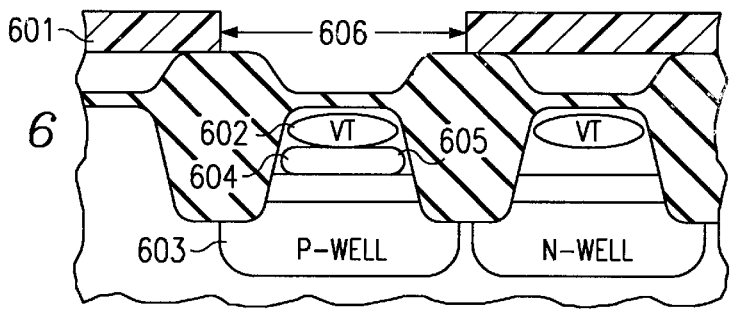
FIG. 6 depicts a schematic cross section of the MOS transistor showing another embodiment of the invention.

FIG. 6 illustrates schematically another embodiment of the invention, especially important for MOS transistors with very short channel length (0.2 $\mu$m and less). A "halo" or "pocket" region 601 has been created around the source 610 and a similar region 602 around drain 611 by an additional p-type implant, creating regions of enhanced p-doping. The source 610 consists again of a deep source 310 and an extended source 311. The deep source 310 is recessed relative to the extended source 311. Similarly, the deep drain 312 is recessed compared to the extended drain 313. The region 620 of higher resistivity, created by this invention, extends laterally from the vicinity of one of the recessed regions to the vicinity of the other. Region 620 extends vertically from a depth just below the halo/pocket regions and the depletion regions of source and drain to approximately the top of the channel stop region.

The method and process flow for fabricating an IC MOS transistor with increased substrate resistance is outlined in the schematic and simplified FIGS. 7 to 12 for the example of an NMOS transistor; analogous process steps apply for the fabrication of a PMOS transistor.

Figure 7:
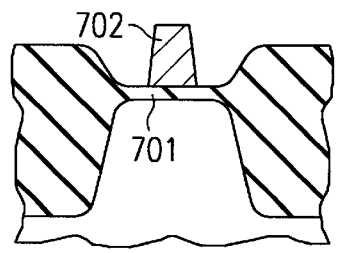
FIGS. 7 to 10 are schematic and simplified cross sections of an MOS transistor illustrating individual process steps in the fabrication flow according to the invention.
Figure 8:
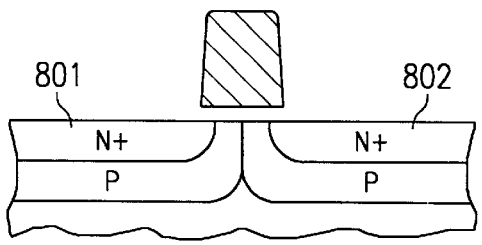
Figure 9:
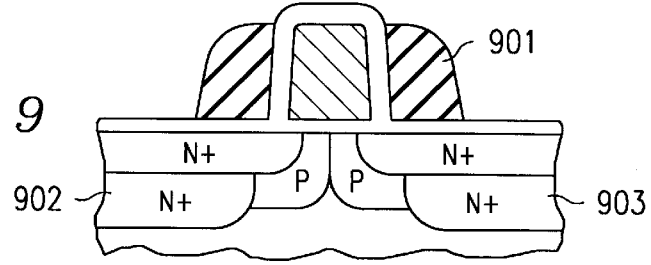
Figure 10:
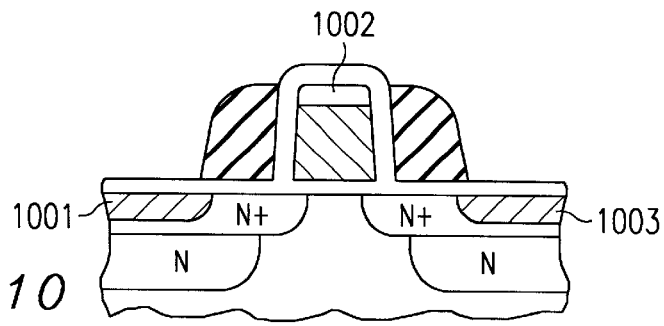

FIG. 7: selecting a p-type semiconductor 701 as substrate; may be an epitaxial material;

FIG. 7: forming non-conductive electrical isolation regions 704 into p-type semiconductor 701 for defining the lateral boundaries of the NMOS transistor active area;

FIG. 8: depositing a first photomask layer 801 and opening a window 802 therein, exposing the surface of the area between the isolation regions;

FIG. 8: implanting low-energy p-doping ions into the exposed surface area, creating a shallow layer 802 suitable for adjusting the threshold voltage;

FIG. 8: implanting high-energy p-doping ions into the exposed surface area, creating the p-well 803;

FIG. 8: implanting medium-energy p-doping ions into the exposed surface area, creating a deep layer 804 suitable as channel stop;

FIG. 8: implanting high-energy compensating n-doping ions into the exposed surface area, creating a region 805 at predetermined depth under the surface having a net p-type doping lower than that of the p-type semiconductor remote from the transistor active area;

FIG. 8: removing the first photoresist layer;

FIG. 9: growing over the surface an insulating layer, such as silicon dioxide, suitable as gate dielectric 901, covering said transistor area;

FIG. 9: depositing a layer of poly-silicon or other conductive material onto the insulating layer;

FIG. 9: protecting a portion of the poly-silicon and etching the remainder thereof, defining the gate area 902 of the transistor;

FIG. 10: depositing a second photoresist layer and opening a window therein, exposing the surface of the area between the isolation regions;

FIG. 10: implanting, at low energy, n-doping ions into the exposed surface area, creating shallow ndoped layers under the surface, suitable as extended source 1001 and drain 1002 of the transistor;

FIG. 10: removing the second photoresist layer;

FIG. 11: depositing conformal insulating layers of an insulator, such as silicon nitride or silicon dioxide, over the surface and directional plasma etching this insulating layers so that only side walls 1101 around the poly-silicon gate remain;

FIG. 11: depositing a third photoresist layer and opening a window therein, exposing the surface of the area between the isolation regions;

FIG. 11: implanting, at medium energy, n-doping ions into the exposed surface area, creating an n-doped region that extends to a medium depth under the surface, suitable as deep source 1102 and drain 1103 of the transistor;

FIG. 11: removing the third photoresist layer;

FIG. 12: forming suicides 1201, 1202, and 1203;

forming contacts; and depositing the metallizations.

The method described above can be expanded in FIG. 10, after forming the extended source and drain, to include the step of implanting p-doping ions around the extended source and drain to form pockets/halos of enhanced p-doping around the deep source and drain.

It is advisable to add the process step of annealing the high energy implant at elevated temperature. Of course, the process steps can be modified by implanting the n-doping ions at high energy after the process step of implanting the n-doping ions at medium energy.

For fabricating a PMOS transistor according to the method of the present invention, the flow of the above process steps applies in analogous fashion with a reversal of conductivity types.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. An integrated circuit fabricated in a semiconductor of a first conductivity type, said circuit having at the surface at least one lateral MOS transistor bordered on each side by an isolation region and below said surface by a channel stop region, comprising:

a source and a drain, each comprising at said surface two regions of the opposite conductivity type, one of said regions shallow and extending to the transistor gate, the other of said regions deeper and recessed from said gate, together defining the active area of said transistor and having a depletion region when reverse biased;

another semiconductor region within said semiconductor, of said first conductivity type, having a resistivity higher than the remainder of said semiconductor, extending laterally from the vicinity of one of said recessed regions to the vicinity of the other; and said high resistivity region extending vertically from a depth just below the depletion regions of said source and drain to approximately the top of said channel stop region.

2. The circuit according to claim 1 wherein said semiconductor of the first conductivity type is a semiconductor epitaxial layer.

3. The circuit according to claim 1 wherein said semiconductor material is selected from a group consisting of silicon, silicon germanium, gallium arsenide, and any other semiconductor material used in integrated circuit fabrication.

4. The circuit according to claim 1 wherein said region of higher resistivity within said semiconductor of the first conductivity type has a resistivity at least an order of magnitude higher than the resistivity of said semiconductor of the first conductivity type.

5. The circuit according to claim 1 wherein said depletion regions have a depth of about 40 to 50 nm from said surface so that said high resistivity region extends vertically from about 50 to 150 nm from said surface.

6. The circuit according to claim 1 wherein said semiconductor of the first conductivity type is made of p-type silicon in the resistivity range from about 1 to 50 $\Omega$cm, and said source, drain, and their extensions are made of n-type silicon.

7. The circuit according to claim 1 wherein said semiconductor of the first conductivity type has a dopant species selected from a group consisting of boron, aluminum, gallium, and indium, while said source, drain, their extensions, and said region of higher resistivity within said semiconductor of the first conductivity type have a dopant species selected from a group consisting of arsenic, phosphorus, antimony, and bismuth.

8. The circuit according to claim 1 wherein said semiconductor of the first conductivity type is made of n-type silicon in the resistivity range from about 1 to 50 $\Omega$cm, and said source, drain, and their extensions are made of p-type silicon.

9. The circuit according to claim 1 wherein said semiconductor of the first conductivity type has a dopant species selected from a group consisting of arsenic, phosphorus, antimony, bismuth, and lithium, while said source, drain, their extensions, and said region of higher resistivity within said semiconductor of the first conductivity type have a dopant species selected from a group consisting of boron, aluminum, gallium, indium, and lithium.

10. The circuit according to claim 1 wherein said gate has a narrow dimension from about 0.2 to 1.0 $\mu$m.

11. The circuit according to claim 1 wherein said source and drain are each surrounded by a zone of enhanced doping of the first conductivity type.

12. The circuit according to claim 1 wherein said region of higher resistivity is the substrate of said transistor, enabling full functioning of said transistor while not affecting operation of neighboring active devices.

13. The circuit according to claim 11 wherein said region of higher resistivity further improves the ESD protection of said transistor without decreasing latch-up robustness or increasing inadvertent substrate current-induced body biasing of neighboring transistors.

* * * * *

UNITED STATES PATENT AND TRADEMARK OFFICE
CERTIFICATE OF CORRECTION

PATENT NO.    : 6,452,236 B1                                       Page 1 of 1
DATED         : September 17, 2002
INVENTOR(S)   : Nandakumar et al.

It is certified that error appears in the above-identified patent and that said Letters Patent is hereby corrected as shown below:

<u>Title page,</u>
Item [75], please amend first inventor's last name from "Nadakumar" to
-- Nandakumar --

Signed and Sealed this

Twenty-fifth Day of February, 2003

JAMES E. ROGAN
*Director of the United States Patent and Trademark Office*